US006287151B1

(12) United States Patent
Matsuzaki et al.

(10) Patent No.: US 6,287,151 B1
(45) **Date of Patent: *Sep. 11, 2001**

(54) ELECTRICAL CONNECTOR FOR MANIPULATION BY A VACUUM-SUCTION NOZZLE

(75) Inventors: Shinichi Matsuzaki, Tokyo; Toshihiro Niitsu, Machida, both of (JP)

(73) Assignee: Molex Incorporated, Lisle, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,239

(22) Filed: Dec. 7, 1999

(30) Foreign Application Priority Data

Jan. 29, 1999 (JP) ........................................ 11-020940

(51) Int. Cl.[7] .......................... H01R 12/00; H05K 1/00

(52) U.S. Cl. .......................... 439/630; 439/66; 439/940

(58) Field of Search .............................. 439/940, 630, 439/66

(56) References Cited

U.S. PATENT DOCUMENTS

| | | | | |
|---|---|---|---|---|
| 3,545,606 | | 12/1970 | Bennett | 206/56 |
| 4,396,245 | | 8/1983 | Lane | 339/38 |
| 4,795,354 | | 1/1989 | Owen | 439/137 |
| 5,055,971 | | 10/1991 | Fudala et al. | 361/400 |
| 5,160,268 | * | 11/1992 | Hakamian | 439/66 |
| 5,242,311 | | 9/1993 | Seong | 439/135 |
| 5,249,977 | | 10/1993 | Tanaka et al. | 439/135 |
| 5,277,601 | | 1/1994 | Miyazawa | 439/135 |
| 5,361,492 | | 11/1994 | Miyazawa | 29/879 |
| 5,681,174 | | 10/1997 | Correll, Jr. et al. | 439/135 |
| 5,688,133 | | 11/1997 | Ikesugi et al. | 439/135 |
| 5,879,169 | * | 3/1999 | Wu | 439/940 |
| 5,975,914 | * | 11/1999 | Uchida | 439/66 |
| 6,068,514 | * | 5/2000 | Zuin | 439/630 |
| 6,086,424 | * | 7/2000 | Chang | 439/630 |
| 6,142,790 | * | 11/2000 | Niitsu | 439/66 |

FOREIGN PATENT DOCUMENTS

0993082-A1 * 12/2000 (EP) .

* cited by examiner

*Primary Examiner*—Renee Luebke
*Assistant Examiner*—Felix O. Figueroa
(74) *Attorney, Agent, or Firm*—Stephen Z. Weiss

(57) ABSTRACT

An electrical connector is adapted for manipulation by a vacuum-suction nozzle. The connector includes a dielectric housing having a top surface. A plurality of terminals are mounted on the housing. Each terminal has a spring contact arm extending above the top surface of the housing. The terminals are arranged into a plurality of distinct groups. The spring contact arms of the terminals in one group are oriented different from the spring contact arms of the terminals in at least one other group. The groups are arranged to leave a surface area of the housing top surface of a size sufficient for engagement by the vacuum-suction nozzle.

5 Claims, 2 Drawing Sheets

ELECTRICAL CONNECTOR FOR MANIPULATION BY A VACUUM-SUCTION NOZZLE

FIELD OF THE INVENTION

This invention generally relates to the art of electrical connectors and, particularly, to an electrical connector which is adapted for vacuum transfer and placement.

BACKGROUND OF THE INVENTION

Vacuum transfer and placement mechanisms are well known in the electronic assembly art and are used for retrieving electronic components, such as connectors, from a supply source and transferring them by applying negative air pressure to the connectors and placing them onto a printed circuit board in preselected positions for soldering. Typically, such mechanisms are used with robotic assemblers and include a transfer arm with an engagement end that is pneumatically connected to a source of negative air pressure. This negative air pressure creates a vacuum at a vacuumsuction nozzle at the engagement end of the transfer arm which can be used to effectively "grab" a connector so that the connector may be robotically transferred into a placement position with great accuracy onto a circuit board or like component.

With the ever-increasing miniaturization of electronic circuits and components, it often is difficult to provide a surface area of a size sufficient for engagement by a vacuum-suction nozzle. In fact, most electrical connectors, particularly electronic connectors for mounting on a printed circuit board, are devoid of large flat portions which can be engaged by the vacuum-suction nozzle. For instance, one type of connector adapted for mounting on a circuit board includes a plurality of terminals arranged side-by-side in a generally parallel array, with each terminal having an inclined cantilever-like spring contact arm extending upwardly and having a contact portion projecting above the top surface of the connector housing. The cantilevered spring contact arms are inclined in opposite directions alternatingly lengthwise of the connector to provide balanced forces when the contact portions of the arms are engaged by a complementary mating connector, a second A printed board or the like. By alternating the terminals, there is no room whatsoever for a flat surface area engageable by a vacuum-suction nozzle.

One solution to the above problem would be to simply enlarge the connector to provide an adequate surface area for the vacuum-suction nozzle to engage. This solution is unacceptable because the enlarged connector would take up too much valuable "real estate" on the printed circuit board. Another solution to the problem would be to eliminate the alternating arrangement of the terminals and have all of the terminals with their cantilevered spring contact arms being oriented in only one direction, leaving sufficient area behind the cantilevered arms for engagement by the vacuumsuction nozzle. This solution in unacceptable because the mating forces on all of the spring contact arms oriented in only one direction will create undesirable stresses concentrated at one lateral side of the connector. Such undue stresses could actually destroy the solder connections of the terminals to the circuit traces on the printed circuit board. The present invention is directed to solving these problems by uniquely arranging the terminals in groupings which allow for a sufficient surface area on the housing for engagement by the vacuum-suction nozzle, while avoiding concentration of mating stresses to one side of the connector.

SUMMARY OF THE INVENTION

An object, therefore, of the invention is to provide a new and improved electrical connector adapted for manipulation by a vacuum-suction nozzle.

In the exemplary embodiment of the invention, the connector includes a dielectric housing having a top surface. A plurality of terminals are mounted on the housing, and each terminal includes a spring contact arm extending above the top surface of the housing. The terminals are arranged into a plurality of distinct groups, with the spring contact arms of the terminals in one group being oriented different from the spring contact arms of the terminals in at least one other group. The groups are arranged to leave a surface area of the housing top surface of a size sufficient for engagement by the vacuum-suction nozzle.

As disclosed herein, the spring contact arms comprise upwardly inclined cantilevered arms having contact portions projecting above the top surface of the housing. The cantilevered spring contact arms of the terminals in the one group are inclined upwardly in a direction opposite the inclination of the spring contact arms of the terminals in the at least one other group.

In the preferred embodiment, the housing includes opposite lateral sides. The spring contact arms of the terminals in the one group are located along one lateral side of the housing, and the spring contact arms of the terminals in the at least one other group are located along an opposite lateral side. Preferably, two of the other groups of terminals are located at opposite ends of the one group of terminals to provide a good balancing of the overall mating forces on the terminals.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
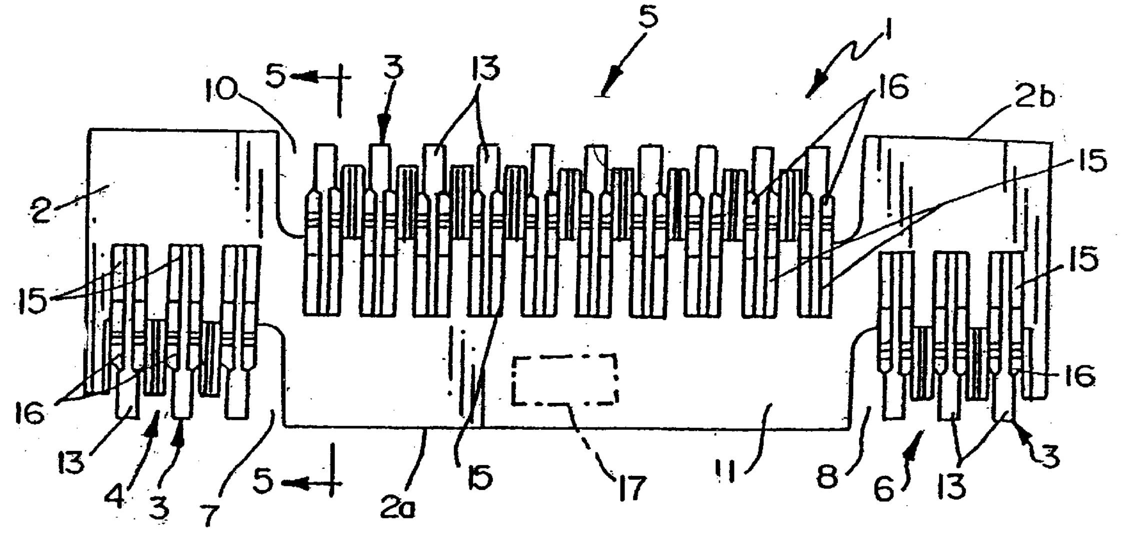
FIG. 1 is a top plan view of an electrical connector embodying the concepts of the invention.
Figure 2:
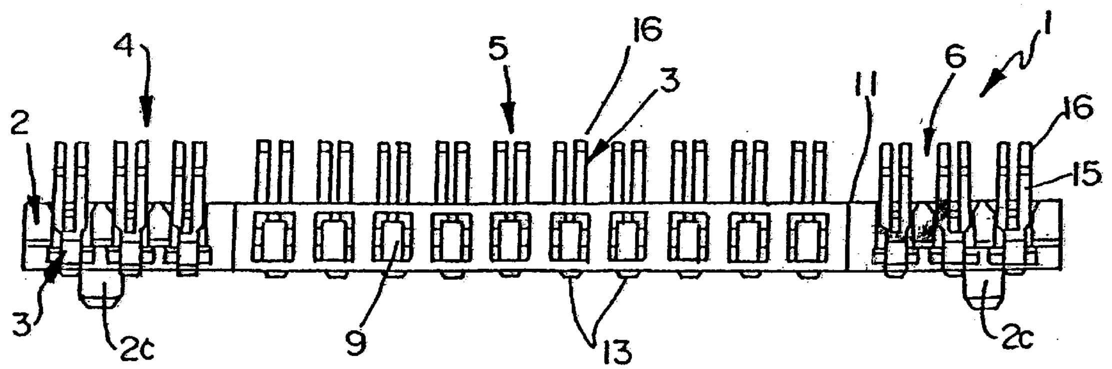
FIG. 2 is a front elevational view of the connector.

Referring to the drawings in greater detail, the invention is embodied in an electrical connector, generally designated 1, which includes a dielectric housing, generally designated 2, mounting a plurality of terminals, generally designated 3. The housing may be molded of dielectric material such as plastic or the like, and the terminals may be stamped and formed of conductive sheet metal material. The connector is adapted for mounting on a printed circuit board. As will be described in greater detail hereinafter, terminals 3 are arranged in three distinct groups or clusters, generally designated 4, 5 and 6.

Figure 3:
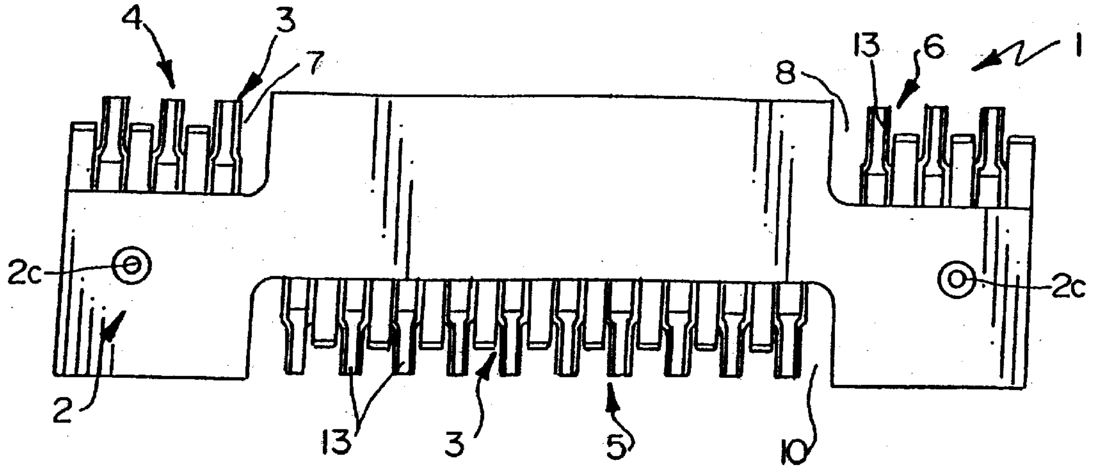
FIG. 3 is a bottom plan view of the connector.
Figure 4:
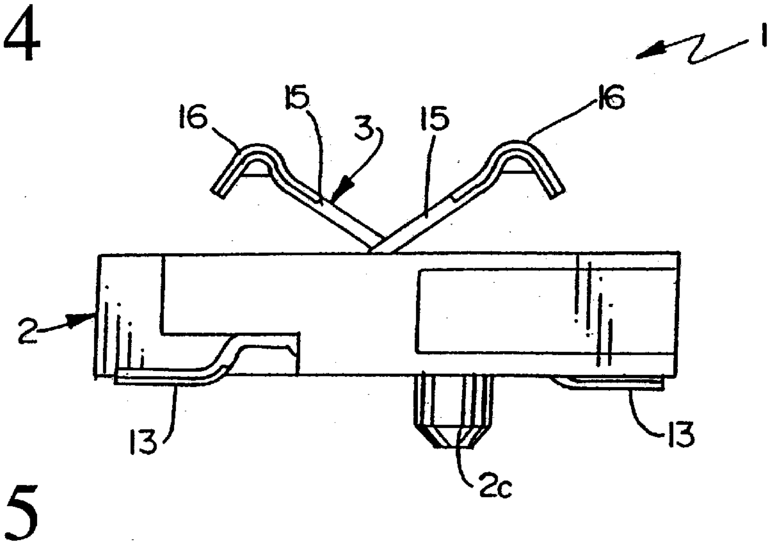
FIG. 4 is an end elevational view of the connector.

More particularly, dielectric housing 2 includes one lateral side **2*a* which has end recesses 7 and 8 (FIGS. 1 and 3), and a second lateral side 2*b* having a central recess 10. Terminals 3 are mounted in housing 2 such that tail portions and contact portions (described hereinafter) of the terminals extend into or toward these recesses 7, 8 and 10 as can be seen in FIGS. 1 and 3. Housing 2 has a top surface 11 which is engageable by a vacuum-suction nozzle to facilitate vacuum transfer and placement of connector 1. The housing has a pair of mounting posts 2***c* projecting from the bottom thereof for insertion into appropriate mounting holes in the printed circuit board on which the connector is mounted.

Figure 5:
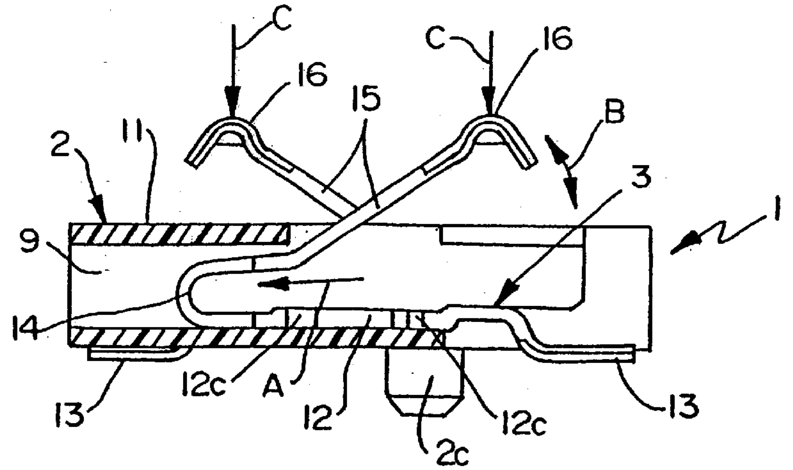
FIG. 5 is an enlarged vertical section taken generally along line 5—5 of FIG. 1.

Referring to FIG. 5, each terminal 3 is generally U-shaped and includes a bottom leg 12 terminating in a tail portion 13 and a top leg 15 terminating in a contact portion 16. The top and bottom legs are joined by a U-shaped bight portion 14 which is inserted in the direction of arrow "A" into a respective terminal-receiving passage 9 in housing 2.

More particularly, and still referring to FIG. 5, bottom leg 12 of each terminal 13 comprises a mounting shank of the terminal and includes teeth 12*c* projecting from opposite edges of the shank for skiving into the plastic material of housing 2 on opposite sides of the respective terminal-receiving passage 9. This rigidly mounts the terminal in the housing. Tail portion 13 at the outer distal end of bottom leg 12 is generally flat for connection, as by soldering, to an appropriate circuit trace on the printed circuit board. Top leg 15 comprises a cantilevered spring contact arm which is inclined upwardly so that contact portion 16 projects above top surface 11 of housing 2. The cantilevered spring contact arm is free to yield and move in the direction of double-headed arrow "B" (FIG. 5). When the connector is mounted on the printed circuit board, a complementary connecting device, which may be a complementary mating connector, a battery pack, or other electronic device, has contacts for engaging contact portions 16 in the direction of arrows "C".

It is significant to note in FIG. 5 that the front terminal is oriented so that cantilevered spring contact arm 15 is inclined upwardly in a right-hand direction. However, a second or rear terminal is shown behind the front terminal and has its cantilevered spring contact arm 15 inclined upwardly in a left-hand direction. Comparing FIG. 5 with the section line 5—5 in FIG. 1, it can be understood that the front terminal shown in FIG. 5 is from group 5, and the rear terminal in FIG. 5 is from group 4 in relation to the groupings of terminals shown in FIG. 1.

Referring back to FIG. 1, it can be seen that groups 4 and 6 of terminals 3 are at opposite ends of group 5 of the terminals. In addition, cantilevered spring contact arms 15 of the terminals in groups 4 and 6 are inclined or directed toward lateral side 2*a* of the housing, while the cantilevered spring contact arms of the terminals in group 5 are inclined or directed toward second lateral side 2*b* of the housing. This allows for a surface area shown in phantom at 17 on top surface 11 of the housing of a size sufficient for engagement by the vacuum-suction nozzle. In prior art connectors, this surface area would not be available, because the orientation of the terminals (i.e., the direction of inclination of spring contact arms 15) would alternate lengthwise of the connector. In addition, by orienting the spring contact arms of the terminals in one group, such as groups 4 and/or 6, in a direction opposite the inclination of the spring contact arms of the terminals in another group, such as group 5, balanced mating forces are applied to the connector. This can be understood by referring back to the direction and location of mating forces "C" in FIG. 5. Although there are more terminals in group 5 than the total terminals in groups 4 and 6, the distribution of forces has been found sufficient to prevent undue stresses on the connector, particularly the solder connections between tail portions 13 and the printed circuit board, which might cause damage to the board connections.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electrical connector adapted for manipulation by a vacuum-suction nozzle, the nozzle having a cross sectional shape with given dimensions, comprising:

a dielectric housing having a top surface;

a plurality of terminals mounted on the housing, each terminal having a spring contact arm defined by a U-shaped on and a contact portion extending above the top surface of the housing; and said terminals being arranged into a plurality of distinct groups with the U-shaped bight portions and contact portions of each group in lateral alignment with one another along two parallel lines with the spring contact arms of the terminals in one group being oriented opposite from the spring contact arms of the terminals in at least one other group and with the contact portion of the terminals in said one group located between the two parallel lines formed by the lateral alignment of the U-shaped bight portions and the contact portions of the terminals in at least one other group, the terminals in each group all having the same orientation as an adjacent terminal in each group, and the groups being arranged to leave a surface area of said top surface between at lit two of the distinct groups, the surface area also being located above the U-shaped bight portions of another group of terminals and having a shape and dimensions greater than the cross sectional shaped and given dimensions of the nozzle.

2. The electrical connector claim 1 wherein said spring contact arms comprise upwardly inclined cantilevered arms having contact portions projecting above the top surface of the housing.

3. The electrical connector claim 2 wherein the cantilevered spring contact arms of the terminals in said one group are inclined upwardly in a direction opposite the inclination of the cantilevered spring contact arms of the terminals in said at least one other group.

4. The electrical connector claim 1 wherein said housing includes opposite lateral sides, the spring contact arms of the terminals in said one group being located along one lateral side of the housing and the spring contact arms of the terminals in said at least one other group being located along an opposite lateral side of the housing.

5. The electrical connector claim 4, including two of said other groups of terminals located at opposite ends of said one group of terminals.

* * * * *